United States Patent
Park et al.

(10) Patent No.: US 11,215,920 B2
(45) Date of Patent: Jan. 4, 2022

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Ju yun Park, Seongnam-si (KR); Se jin Park, Seoul (KR); Myung Soo Noh, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/936,598

(22) Filed: Jul. 23, 2020

(65) Prior Publication Data

US 2021/0191253 A1 Jun. 24, 2021

(30) Foreign Application Priority Data

Dec. 19, 2019 (KR) .................. 10-2019-0170639

(51) Int. Cl.
*G06F 30/00* (2020.01)
*G03F 1/36* (2012.01)

(52) U.S. Cl.
CPC ...................... *G03F 1/36* (2013.01)

(58) Field of Classification Search
CPC ........................................................ G03F 1/36
USPC .......................................................... 716/53
See application file for complete search history.

(56) References Cited

U.S. PATENT DOCUMENTS

| | | | |
|---|---|---|---|
| 5,815,685 A | 9/1998 | Kamon | |
| 6,301,697 B1* | 10/2001 | Cobb | G03F 7/70441 703/1 |
| 7,281,222 B1* | 10/2007 | Babcock | G06F 30/39 716/53 |
| 7,325,225 B2 | 1/2008 | Tanaka et al. | |
| 10,242,921 B2 | 3/2019 | Park et al. | |
| 2006/0003240 A1 | 1/2006 | Shim et al. | |
| 2006/0060781 A1* | 3/2006 | Watanabe | B82Y 10/00 250/310 |
| 2006/0245636 A1* | 11/2006 | Kitamura | G06K 9/036 382/149 |
| 2008/0032207 A1* | 2/2008 | Graeupner | G03F 7/70308 430/5 |

(Continued)

FOREIGN PATENT DOCUMENTS

| | | |
|---|---|---|
| KR | 10-0914297 B1 | 8/2009 |
| KR | 10-2011-0001140 A | 1/2011 |

*Primary Examiner* — Suchin Parihar
(74) *Attorney, Agent, or Firm* — Lee IP Law, PC

(57) ABSTRACT

A method includes performing OPC on a first mask design having a plurality of patterns having line widths; measuring a number of each of the line widths within the first mask design on which the OPC was performed; obtaining a probability distribution of each of the line widths within the first mask design on which the OPC was performed; obtaining a distribution of each of the line widths by multiplying the number of each of the line widths by the probability distribution; obtaining a line width distribution of the first mask design by summing the distribution of each of the line widths; comparing a probability distribution within a first critical line width in the line width distribution with a first critical probability; and performing the OPC on the first mask design again if the probability distribution within the first critical line width is greater than the first critical probability.

20 Claims, 15 Drawing Sheets

(56) References Cited

U.S. PATENT DOCUMENTS

| | | | |
|---|---|---|---|
| 2008/0178141 A1* | 7/2008 | Sato | G03F 1/36 |
| | | | 716/53 |
| 2009/0148780 A1 | 6/2009 | Yasuzato | |
| 2010/0215247 A1* | 8/2010 | Kitamura | G06T 7/001 |
| | | | 382/149 |
| 2011/0194751 A1* | 8/2011 | Takimoto | G06T 7/001 |
| | | | 382/144 |
| 2016/0246168 A1* | 8/2016 | Ye | G03F 7/705 |
| 2017/0024510 A1* | 1/2017 | Shin | G06F 30/398 |

* cited by examiner

FIG. 8

Table 1

| D1(A.U) | Mask A | # of D1 Mask B | Mask C |
|---|---|---|---|
| A1 | 0 | 0 | 0 |
| A2 | 0 | 0 | 0 |
| A3 | 0 | 0 | 0 |
| A4 | 0 | 0 | 0 |
| A5 | 0 | 0 | 0 |
| A6 | 0 | 0 | 0 |
| A7 | 0 | 0 | 0 |
| A8 | B1 | B3 | B2 |
| A9 | B2 | B5 | B7 |
| A10 | B3 | B6 | B8 |
| A11 | B4 | B7 | B9 |
| A12 | B5 | B7 | B10 |
| ORC criteria pass | Pass | Pass | Pass |

ORC criteria = A8

FIG. 11

Table 2

| D2(A.U) | # of D2 | | |
|---|---|---|---|
| | Mask A | Mask B | Mask C |
| C1 | 0 | 0 | 0 |
| C2 | 0 | 0 | 0 |
| C3 | D1 | D3 | D5 |
| C4 | D2 | D4 | D6 |
| C5 | D4 | D7 | D8 |
| ORC criteria pass | Pass | Pass | Pass |

ORC criteria = C3 ⭡

FIG. 14

Table 3

| D2(A.U) | # of D3 | | |
|---|---|---|---|
| | Mask A | Mask B | Mask C |
| B1 | 0 | 0 | 0 |
| B2 | 0 | 0 | 0 |
| B3 | F1 | F3 | F5 |
| B4 | F2 | F4 | F6 |
| B5 | F4 | F7 | F8 |
| ORC criteria pass | Pass | Pass | Pass |

ORC criteria = B3

SEMICONDUCTOR DEVICE AND METHOD OF FABRICATING THE SAME

CROSS-REFERENCE TO RELATED APPLICATION

Korean Patent Application No. 10-2019-0170639, filed on Dec. 19, 2019, in the Korean Intellectual Property Office, and entitled: "Optical Proximity Correction Rule Check Method and Semiconductor Device Fabricating Method Including the Same," is incorporated by reference herein in its entirety.

BACKGROUND

1. Field

Embodiments relate to an optical proximity correction (OPC) rule check method and a semiconductor device fabricating method including the same.

2. Description of the Related Art

In designing an integrated circuit, a circuit layout may be made to be transferred onto a wafer surface through a photomask to form a desired circuit on a semiconductor substrate. As a semiconductor device becomes highly integrated, and thus the design of the integrated circuit becomes complicated, it becomes important to accurately implement a pattern layout according to the originally intended design on a semiconductor fabrication mask used in a photolithography process.

SUMMARY

Embodiments are directed to a method, including performing an optical proximity correction (OPC) on a first mask design, the first mask design including a plurality of patterns having line widths, measuring a number of each of the line widths within the first mask design on which the OPC has been performed, obtaining a probability distribution of each of the line widths within the first mask design on which the OPC has been performed, obtaining a distribution of each of the line widths by multiplying the number of each of the line widths by the probability distribution, obtaining a line width distribution of the first mask design by adding up the distribution of each of the line widths, comparing a probability distribution within a first critical line width in the line width distribution of the first mask design with a first critical probability, and performing the OPC on the first mask design again if the probability distribution within the first critical line width is greater than the first critical probability.

Embodiments are also directed to a method, including performing an optical proximity correction (OPC) on a first mask design, the first mask design including a plurality of patterns having line widths, checking whether a line width smaller than a first critical line width is present in the first mask design on which the OPC has been performed, performing the OPC on the first mask design again if a line width smaller than the first critical line width is present in the first mask design, fabricating a first mask from the first mask design to which the OPC has been applied if a line width smaller than the first critical line width is not present in the first mask design, transferring patterns of the fabricated first mask onto a wafer, comparing line widths of patterns in the wafer with the line widths in the first mask design to determine a defect probability of the line widths in the wafer, performing the OPC on the first mask design again if the defect probability is out of a process margin range, performing the OPC on a second mask design that is different from the first mask design if the defect probability is within the process margin range, the second mask design including a plurality of patterns having line widths, measuring a number of each of line widths within the second mask design on which the OPC has been performed, obtaining a probability distribution of each of the line widths within the second mask design on which the OPC has been performed, obtaining a distribution of each of the line widths by multiplying the number of each of the line widths by the probability distribution, obtaining a line width distribution of the second mask design by adding up the distribution of each of the line widths, comparing a probability distribution within a second critical line width in the line width distribution of the second mask design with a first critical probability, and performing the OPC on the second mask design again if the probability distribution within the second critical line width is greater than the first critical probability. The first critical probability may be determined based on the defect probability.

Embodiments are also directed to a method, including fabricating a semiconductor fabrication mask through an optical proximity correction (OPC) rule check, and forming a pattern on a substrate using the semiconductor fabrication mask. The OPC rule check may include performing an OPC on a first mask design, the first mask design including a plurality of patterns having line widths, checking whether a line width smaller than a first critical line width is present in the first mask design on which the OPC has been performed, performing the OPC on the first mask design again if a line width smaller than the first critical line width is present in the first mask design, fabricating the semiconductor fabrication mask from the first mask design to which the OPC has been applied if a line width smaller than the first critical line width is not present in the first mask design, transferring patterns of the semiconductor fabrication mask onto a wafer, comparing line widths of patterns in the wafer with the line widths in the first mask design to determine a defect probability of the line widths in the wafer, performing the OPC on the first mask design again if the defect probability is out of a process margin range, performing the OPC on a second mask design that is different from the first mask design if the defect probability is within the process margin range, the second mask design including a plurality of patterns having line widths, measuring a number of each of line widths within the second mask design on which the OPC has been performed, obtaining a probability distribution of each of the line widths within the second mask design on which the OPC has been performed, obtaining a distribution of each of the line widths by multiplying the number of each of the line widths by the probability distribution, obtaining a line width distribution of a portion of the second mask design by adding up the distribution of each of the line widths, comparing a probability distribution within a second critical line width in the line width distribution of the portion of the second mask design with a first critical probability, and performing the OPC on the second mask design again if the probability distribution within the second critical line width is greater than the first critical probability. The first critical probability may be determined based on the defect probability.

BRIEF DESCRIPTION OF THE DRAWINGS

Features will become apparent to those of skill in the art by describing in detail example embodiments with reference to the attached drawings in which:

FIG. 8 is an example table explaining the OPC rule check method using a line width distribution of each mask.

FIG. 11 is an example table explaining the OPC rule check method using a line width distribution in each mask.

FIG. 14 is an example table explaining the OPC rule check method using a line width distribution in each mask.

DETAILED DESCRIPTION OF THE EMBODIMENTS

Figure 1:
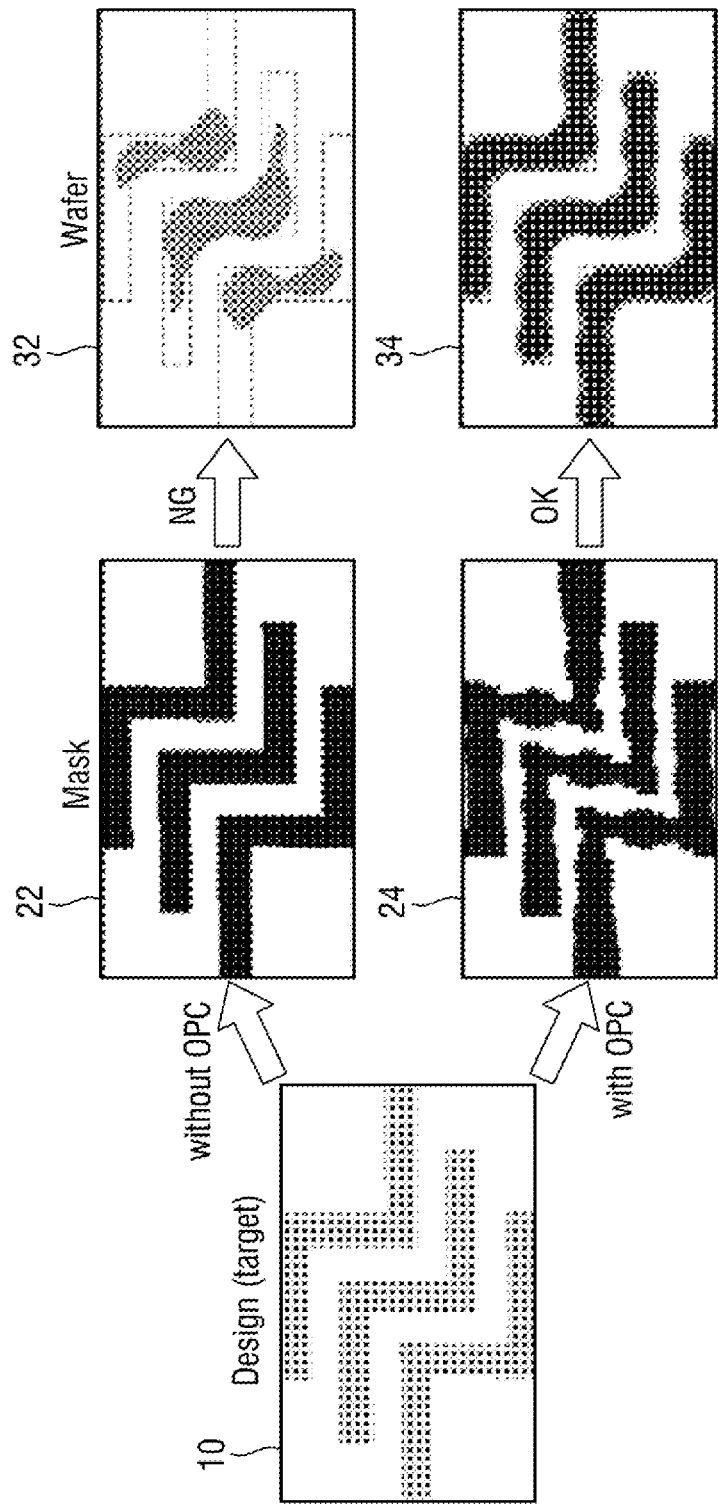
FIG. 1 is an example diagram explaining an optical proximity correction.

FIG. 1 is an example diagram explaining an optical proximity correction.

An optical proximity correction (OPC) will be exemplarily described with reference to FIG. 1. A lithography process is a process of applying a photoresist on a wafer (or substrate), and then performing exposure and development. The lithography process may be performed before an etching process or an ion-implantation process which uses a mask.

As a semiconductor device becomes highly integrated, a size and a pitch of a pattern forming a circuit become smaller. Therefore, among semiconductor device fabricating processes, a technique of the lithography process may appropriately control the amount of light emitted through a mask, thereby enabling a circuit design in a semiconductor fabrication mask to be elaborate.

However, as the integration density of the semiconductor device increases, the size of a pattern formed in the mask becomes close to a wavelength of a light source. As a result, in the lithography process, an influence of diffraction and interference of light may increase, resulting in the pattern formed in the mask being distorted on the wafer (or substrate).

For example, if it is assumed that a target design pattern 10 to be formed on a wafer (or substrate) is formed on a mask 22 without any correction, when the lithography process is performed using the mask 22, the originally intended pattern may be formed on the wafer 32 in a severely distorted state. For example, an optical proximity effect (OPE) may occur in which a corner portion of the target design pattern 10 is distortedly formed on the wafer 32 as a round shape.

As a technique for removing the above-described OPE, the OPC may be used. The OPC deliberately modifies the shape of the target design pattern 10 to correct the pattern distortion. The OPC may include, for example, forming a mask 24 by adding a serif pattern or a hammer head pattern to a line end of the target design pattern 10. When the pattern of the mask 24, to which the OPC has been applied, is transferred onto the wafer (or the substrate), a pattern shape close to the originally intended pattern shape may be formed on a wafer 34.

The OPC illustrated in FIG. 1 is one example among various OPCs. For example, other than the example of FIG. 1, a scattering bar insertion method may be used as an OPC in which sub-resolution scattering bars are added to the periphery of the target design pattern 10 to minimize a variation in the line width of the pattern caused by pattern density.

In order to increase accuracy of the OPC, an OPC rule check (ORC) may be implemented after performing the OPC. Using the OPC rule check, the OPC may be verified by performing simulation to predict a distribution of line widths (critical dimensions (CDs)) of the pattern in a case of exposing the wafer through the mask 24 fabricated by applying the OPC.

Through the OPC rule check according to an example embodiment, the line width distribution of the pattern is predicted in advance in the case of exposing the wafer through the mask 24 fabricated by applying the OPC. Therefore, a problem that a defect occurs in the pattern of the wafer may be prevented beforehand.

Figure 2:
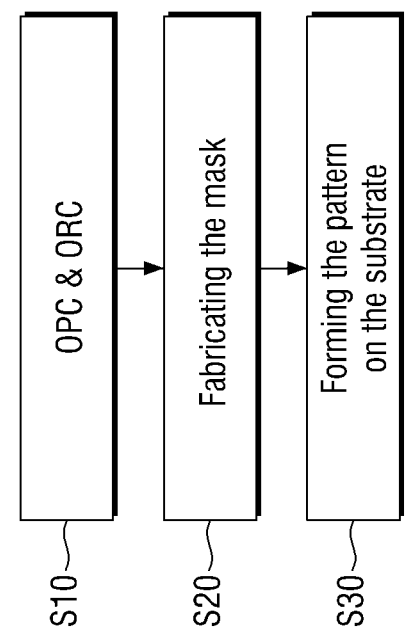
FIG. 2 is an example flowchart describing a semiconductor device fabricating method including an optical proximity correction verification method according to an example embodiment.

FIG. 2 is an example flowchart describing a semiconductor device fabricating method including an optical proximity correction verification method according to an example embodiment.

Referring to FIG. 2, after performing the OPC, the OPC rule check according to an example embodiment is performed (operation S10).

A semiconductor fabrication mask is fabricated to have a pattern applied with the OPC of which reliability has been secured through the OPC rule check according to an example embodiment (operation S20).

Subsequently, using the semiconductor fabrication mask fabricated in the operation S20, the pattern may be formed on a substrate (or wafer) through a lithography process (operation S30).

Hereinafter, a detailed description will be made of the OPC and the OPC rule check for improving the accuracy and reliability of the OPC according to the operation S10.

Figure 3:
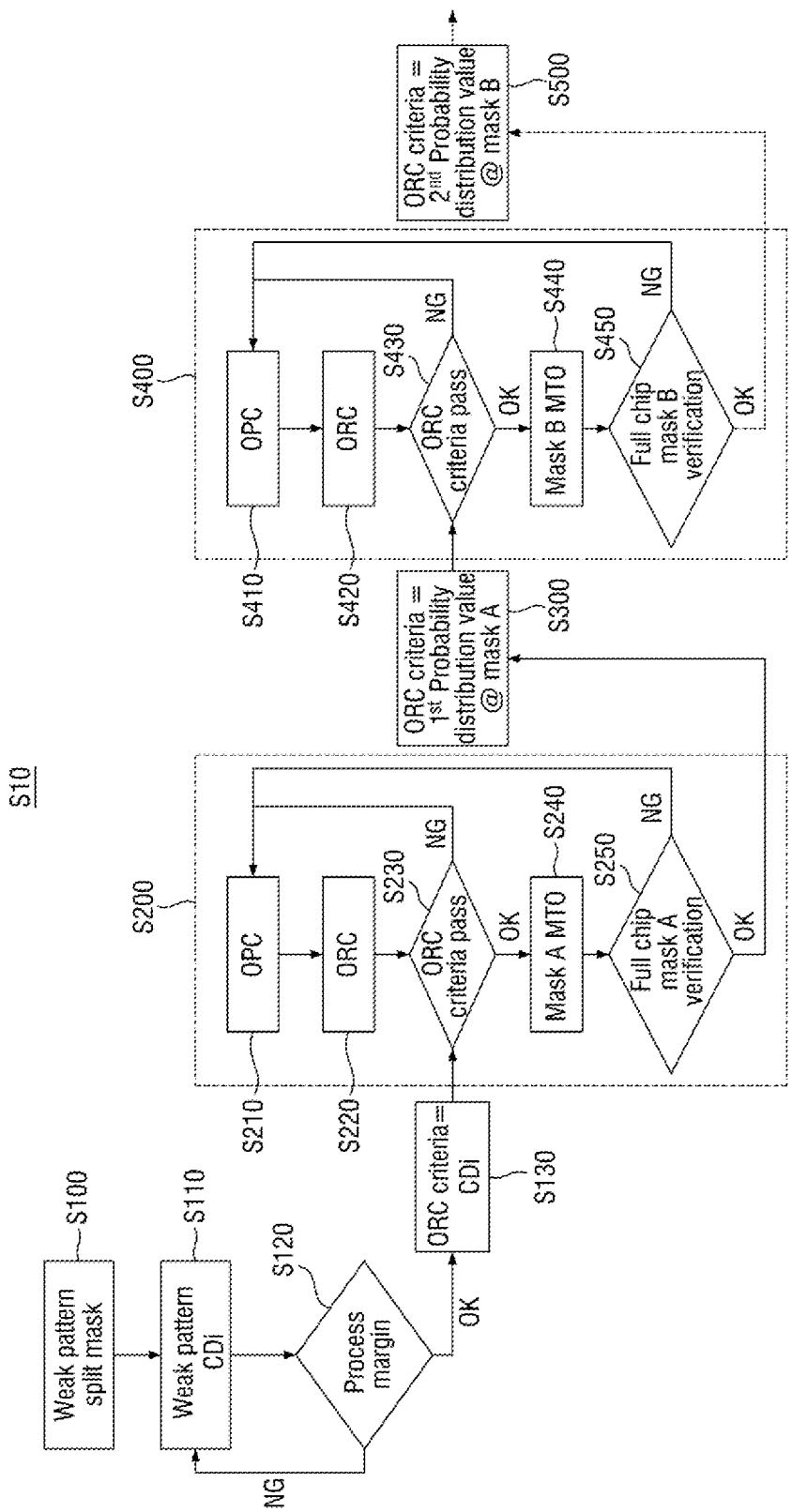
FIG. 3 is an example flowchart describing an optical proximity correction verification method according to an example embodiment.
Figure 4:
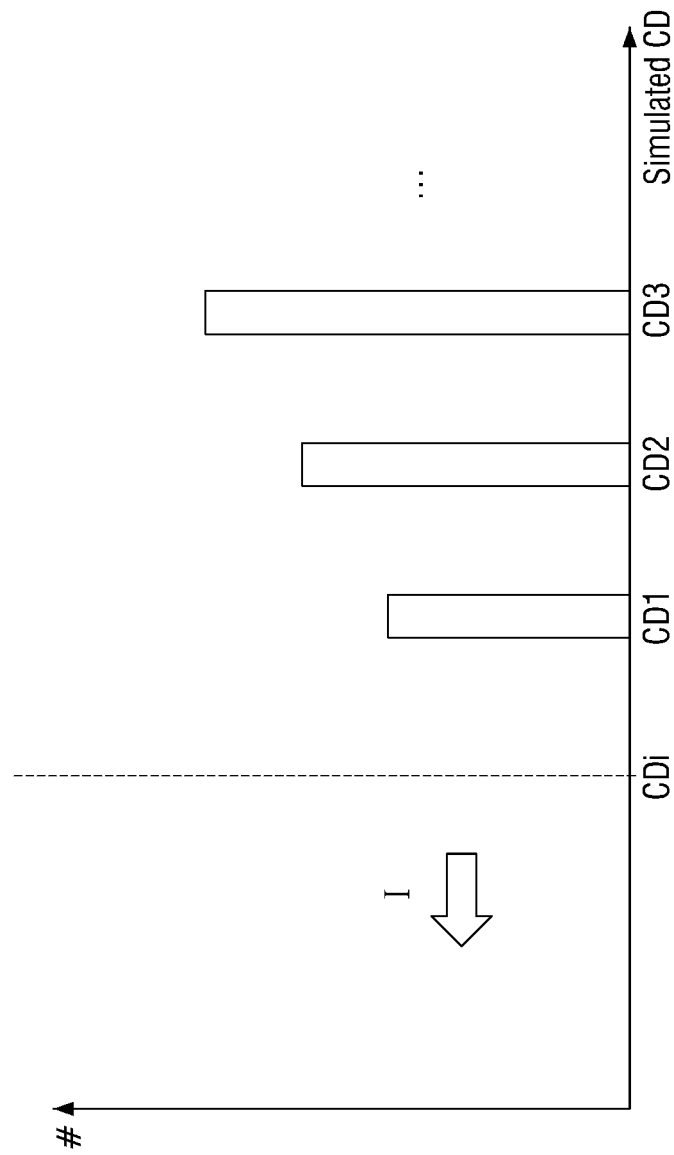
FIG. 4 is an example graph explaining operation S230 of FIG. 3.
Figure 5:
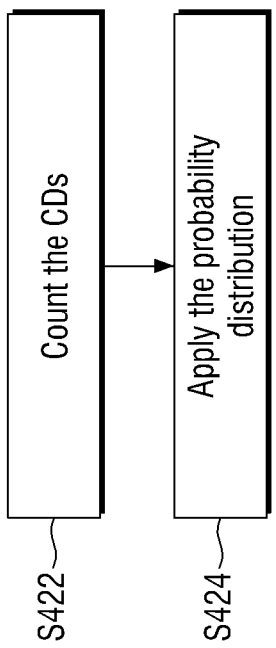
FIG. 5 is an example flowchart explaining operation S420 of FIG. 3.
Figure 6:
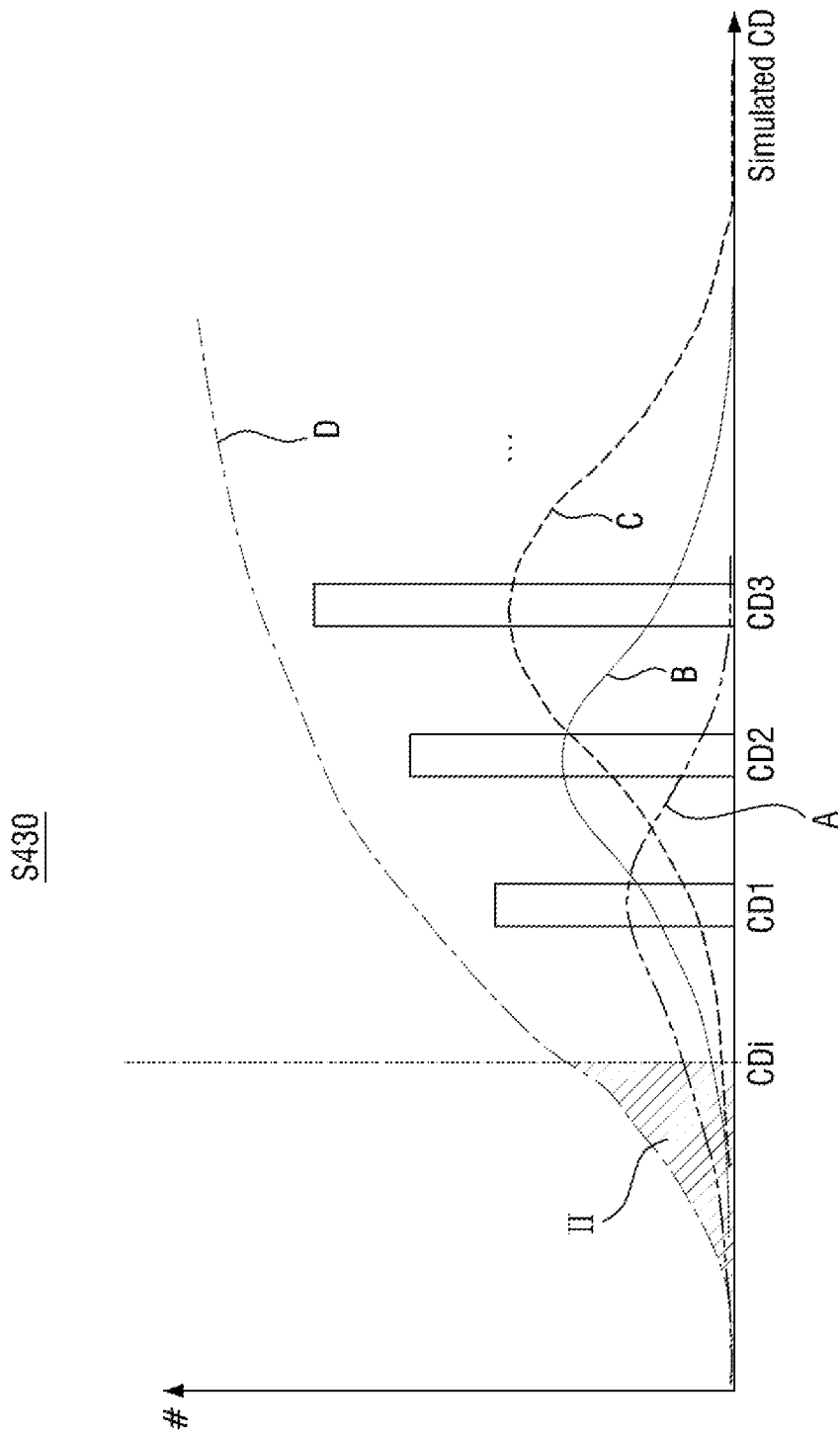
FIG. 6 is an example flowchart explaining operation S430 of FIG. 3 and FIG. 5.

FIG. 3 is an example flowchart describing an optical proximity correction verification method according to an example embodiment. FIG. 4 is an example graph explaining operation S230 of FIG. 3. FIG. 5 is an example flowchart explaining operation S420 of FIG. 3. FIG. 6 is an example flowchart explaining operation S430 of FIG. 3 and FIG. 5.

Note that, although Mask A, Mask B, and Mask C have been described in drawings, they may be referred to by a first mask, a second mask, and a third mask, respectively. Hereinafter, the Mask A, the Mask B, and the Mask C shown in the drawings will be described as the first mask, the second mask, and the third mask, respectively.

Referring to FIG. 3, the OPC and the OPC rule check are performed on the first mask (operation S200). The OPC and the OPC rule check according to an example embodiment are performed on the second mask, which is different from the first mask, based on data obtained in the operation S200 (operation S400). By performing the OPC and the OPC rule check according to an example embodiment on a plurality of masks through the operations S200 and S400, a pattern having improved accuracy and reliability may be formed on each substrate by using each of the masks.

Note that, although the operation S200 for processing the first mask and the operation S400 for processing the second mask are shown in FIG. 3, the OPC rule check according to an example embodiment may be applied to the third mask, a fourth mask, and the like other than the first mask and the second mask.

According to an example embodiment, a verification criterion is provided to the OPC rule check in the operation S200 to be used therein. Therefore, before executing the operation S200, a process for providing the verification criterion may be performed to use the verification criterion in the OPC rule check performed on the first mask.

A process for generating the verification criterion to be used in the operation S200 will now be described.

First, a mask in which a layout of a weak pattern is designed may be provided through simulation (operation S100).

If a pattern of the mask is formed as the weak pattern, a pattern bridge or a pattern short may occur when the pattern is formed on the substrate (or wafer) by exposing the substrate through the mask. Thus, the yield in a semiconductor device fabricating process may be deteriorated due to the weak pattern formed in the mask. Therefore, it is important to first determine the criterion forming the weak pattern of the mask.

To this end, a criterion pattern line width CDi is set in the weak pattern provided from the operation S100 (operation S110). The criterion pattern line width CDi may be a criterion of a pattern line width that may form a process margin in the semiconductor fabricating process subsequently performed.

Therefore, it is determined whether the criterion pattern line width CDi is the pattern line width that may secure the margin in the semiconductor fabricating process or not (operation S120). If it is determined that the criterion pattern line width CDi set in the operation S110 is outside a range in which the margin of the semiconductor fabricating process may be secured (if NG), the criterion pattern line width CDi is set again in the operation S110. Otherwise, if it is determined that the criterion pattern line width CDi determined in the operation S110 is in the range in which the margin of the semiconductor fabricating process is secured (if OK), the criterion pattern line width CDi may be selected as a criterion pattern line width to be used in the operation S200 (operation S130). Hereinafter, the criterion pattern line width CDi selected in the operation S130 is referred to as a first critical line width.

The operation S200 for processing the first mask will now be described in detail.

First, the OPC is performed to be applied to a pattern of the first mask (operation S210). As for the OPC, since it has been described with reference to FIG. 1, the redundant description thereof is omitted.

After executing the operation S210, the OPC rule check is performed (operation S220). In the operation S220, data of a plurality of pattern line widths formed in the operation S210 may be extracted. Thus, the number of, e.g., a count of, each pattern line width formed in the operation S210 may be extracted.

Then, data of the pattern line widths extracted in the operation S220 may be compared with the first critical line width CDi selected in the operation S130 (operation S230). The operation S230 will now be described in detail with reference to FIG. 4.

Referring to FIG. 4, in the operation S220, the OPC subjected pattern of the first mask may be measured to obtain a distribution graph of the pattern line widths CD1 to CD3. Then, in the operation S230, based on the first critical line width CDi, it may be determined whether a pattern line width smaller than the first critical line width CDi is present or not among the pattern line widths of the first mask.

Note that the distribution of the line widths is not limited to the illustration of FIG. 4. Thus, other pattern line widths may be added to the pattern line widths CD1 to CD3. Further, the pattern line widths CD1 to CD3 may not be in the form of orderly increasing numbers as shown in the graph of FIG. 4. Further, in the operation S230, the first critical line width CDi is not limited to the illustration of FIG. 4. The first critical line width CDi may be greater than the pattern line width CD1, the pattern line width CD2, or the pattern line width CD3. Further, the determination condition in the operation S230 is not limited to whether a line width smaller than the first critical line width (CDi) is present or not. Thus, the determination condition in the operation S230 may be whether a line width smaller than or equal to the first critical line width CDi is present or not. In the following description on the operation S230, the determination condition is assumed as whether a line width smaller than the first critical line width CDi is present or not.

Referring further to FIG. 4, when a pattern line width smaller than the first critical line width CDi is present among the pattern line widths of the first mask (i.e., when a line width belonging to a region I is present), it is determined that the OPC performed in the operation S210 is incorrect.

When a pattern line width smaller than the first critical line width CDi is not present among the pattern line widths of the first mask (i.e., when a line width belonging to the region I is not present), the OPC performed in the operation S210 is determined to be correct and it proceeds to the next operation.

Referring back to FIG. 3, the operation S230 is described. As described with reference to FIG. 4, if it is determined in the operation S230 that a pattern line width smaller than the first critical line width CDi is present among the pattern line widths of the first mask (if NG), the OPC is performed again in the operation S210.

If it is determined that a pattern line width smaller than the first critical line width CDi is not present among the pattern line widths of the first mask (if OK), the first mask having the pattern applied with the OPC of operation S210 is fabricated (MTO: Mask Tape-Out) (operation S240).

Subsequently, the pattern of the first mask fabricated in the operation S240 may be transferred onto a wafer, and a defect probability of the wafer may be determined (operation S250). Here, if it is determined that the defect probability of the wafer is equal to or greater than a reference value (if NG), the process returns to the operation S210 to perform the OPC on the first mask again.

If it is determined in the operation S250 that the defect probability of the wafer is less than the reference value (if OK), a first critical probability may be determined to be used in the subsequent operation S400, based on the defect probability of the wafer (operation S300).

For example, a probability distribution of a line width is obtained, the line width being at a boundary of a case where the defect probability of the wafer is less than the reference value. The probability distribution of the line width may be determined as the first critical probability. Thus, the ratio of the line width, which cause a criterion defect probability of the wafer, to the whole line widths of the wafer may be determined as the first critical probability. The first critical probability may be a criterion probability to be used in the operation S400.

The operation S400 will now be described in detail.

First, the OPC is performed to be applied to a pattern of the second mask (operation S410). As for the OPC, since it has been described with reference to FIG. 1, the redundant description thereof is omitted.

After executing the operation S410, the OPC rule check is performed (operation S420). In the OPC rule check according to an example embodiment, probability distribution data of each of pattern line widths present in the second mask may be obtained by using data acquired through the OPC in the operation S410. This will now be described in detail with reference to FIG. 5.

Referring to FIG. 5, in the OPC rule check according to an example embodiment, in order to obtain the probability distribution of each pattern line width of the second mask, the number of each pattern line width in the second mask is counted first (operation S422).

Thereafter, the probability distribution of each pattern line width of the second mask may be obtained (operation S424). According to an example embodiment, in the OPC rule check of the operation S420, a distribution of each pattern line width may be obtained by multiplying the number of each pattern line width counted in the operation S422 by the probability distribution of each pattern line width obtained in the operation S424.

The distribution thus obtained may be represented as a graph of FIG. 6.

Referring to FIG. 6, the distribution of each pattern line width may be a linear distribution, not the bar graph of FIG. 4.

Referring to FIGS. 5 and 6, more specifically, the number of each of the pattern line widths of the second mask may be counted in the operation S422. For example, a first pattern line width CD1, a second pattern line width CD2, and a third pattern line width CD3 may be counted as the number N1, the number N2, and the number N3, respectively, in the second mask.

Thereafter, in the operation S424, the probability distribution of each pattern line width of the second mask may be obtained. For example, in the second mask, a probability distribution f(x1) of the first pattern line width CD1, a probability distribution f(x2) of the second pattern line width CD2, and a probability distribution f(x3) of the third pattern line width CD3 may be obtained.

Herein, the function f(x) may have a normal distribution form as in Eq. 1 below, for example.

$$f(x) \approx \frac{1}{\sqrt{2\pi}\,\sigma} e^{-\frac{(x-m)^2}{2\sigma^2}}$$ Eq. 1

In Eq. 1, m is an average of the function f(x) which may be obtained by using the pattern transferred onto the wafer in the operation S250 of FIG. 3. Further, σ is a standard deviation which may be obtained by using the pattern transferred onto the wafer of the operation S250 of FIG. 3.

Thereafter, a graph obtained by multiplying the number of each pattern line width by the probability distribution of each pattern line width may be accumulated to obtain a line width distribution (graph D) of the pattern to be formed in the second mask. For example, in the second mask, a graph A in FIG. 6 is obtained by multiplying the number N1 of the first pattern line width CD1 by the probability distribution f(x1) of the first pattern line width CD1, a graph B is obtained by multiplying the number N2 of the second pattern line width CD2 by the probability distribution f(x2) of the second pattern line width CD2, and a graph C is obtained by multiplying the number N3 of the third pattern line width CD3 by the probability distribution f(x3) of the third pattern line width CD3. The graphs A, B and C may be combined to obtain the graph D representing the line width distribution of the pattern to be formed in the second mask. This may be represented as Eq. 2.

$$D = \Sigma_i N i \times f(xi)$$ Eq. 2

Referring back to FIG. 3, in the operation S420, the line width distribution of the pattern to be formed in the second mask may be obtained to be used in the OPC rule check according to an example embodiment.

Rather than simply obtaining the number of each pattern line width as in the operation S220, obtaining the line width distribution of the pattern by using the probability distribution may increase the accuracy of the OPC rule check, as in the operation S420. Thus, as in the operation S230, even if the OPC has been determined to be correct in the OPC rule check using the criterion pattern line width CDi as a criterion, the defect probability may increase in a case where many weak patterns are formed on the wafer. In this case, although the OPC has been determined to be correct in the operation S230, the OPC may not be determined to be correct in the case where the line width distribution data of the pattern to be formed on the wafer is obtained by using the probability distribution of each pattern line width as in the operation S420 according to an example embodiment. Thus, the accuracy and reliability of the OPC rule check can be improved.

Referring back to FIG. 6, specifically, when the criterion to determine whether an object passes the OPC rule check or not is set as the first critical line width CDi in the operation S230, the first mask passes the OPC rule check in the operation S230. However, the number of each line width present in the highly integrated wafer may increase exponentially. Accordingly, the probability distribution of each line width may be obtained from the wafer onto which the pattern has been transferred through the first mask. Referring to the graph of FIG. 6, any discrete line width data exceeds the first critical line width CDi, but the line width distribution obtained by the probability distribution may be present within the first critical line width CDi as well. Thus, line widths, which may be present within the first critical line width CDi (region II), may be formed in the wafer onto which the pattern has been transferred through the first mask. Therefore, the OPC rule check on the first mask, which is intended to obtain data for the probability distribution function, is performed by using the first critical line width CDi as the criterion.

Herein, when performing the OPC rule check on the subsequent masks, a line width distribution of a pattern present in each mask is calculated by using a probability distribution function to perform the OPC rule check according to an example embodiment based on the distribution data of the pattern line widths of the wafer onto which the pattern has been transferred through the first mask (operation S250 of FIG. 3).

Referring back to FIG. 3, in an example embodiment, when the OPC rule check is performed on the second mask in the operation S420 based on the data measured in the operation S250, the probability distribution of each pattern line width may be obtained to gain the line width distribution of the pattern in the second mask. Although not shown, the OPC rule check according to an example embodiment may be performed on the third mask by using line width data of a pattern of a wafer onto which the pattern is transferred through the second mask.

The line width distribution of the second mask obtained in the operation S420 may be compared with the first critical probability obtained in the operation S300 (operation S430).

Referring to FIGS. 3 and 6, in the graph D representing the line width distribution of the second mask, the probability distribution within the first critical line width CDi is compared with the first critical probability obtained in the operation S300. If the probability distribution within the first critical line width CDi is greater than the first critical probability (if NG), the OPC on the second mask may be performed again. The probability distribution may be calculated by dividing the total number of each line width of the second mask by the number of the line widths present in the region II.

For example, in the graph D representing the line width distribution of the second mask, the number of the line widths included in the region II within the first critical line width CDi may be compared with a critical number to perform the OPC rule check according to an example embodiment.

If the probability distribution within the first critical line width CDi (in the region II) is compared with the first critical probability obtained in the operation S300 and the probability distribution within the first critical line width CDi (in the region II) is equal to or less than the first critical probability (if OK), the second mask is fabricated by applying the OPC of the operation S410 thereto (operation S440).

Subsequently, a pattern of the second mask fabricated in the operation S440 may be transferred onto a wafer to determine a defect probability of the wafer (operation S450). Herein, if it is determined that the defect probability of the wafer is equal to or greater than a reference value (if NG), the process returns to operation S410 to perform the OPC on the second mask again.

If it is determined in the operation S450 that the defect probability of the wafer is less than the reference value (if OK), a second critical probability may be determined to be used in a subsequent operation (not shown) for processing the third mask (not shown), based on the defect probability of the wafer (operation S500). For example, a probability distribution of a line width is obtained, the line width being at a boundary of a case where the defect probability of the wafer is less the reference value. The probability distribution of the line width may be determined as the second critical probability. Thus, the ratio of the line width, which cause a criterion defect probability of the wafer, to the whole line widths of the wafer may be determined as the second critical probability. The second critical probability may be a criterion probability to be used in the operation (not shown) for processing the third mask (not shown).

Figure 7:
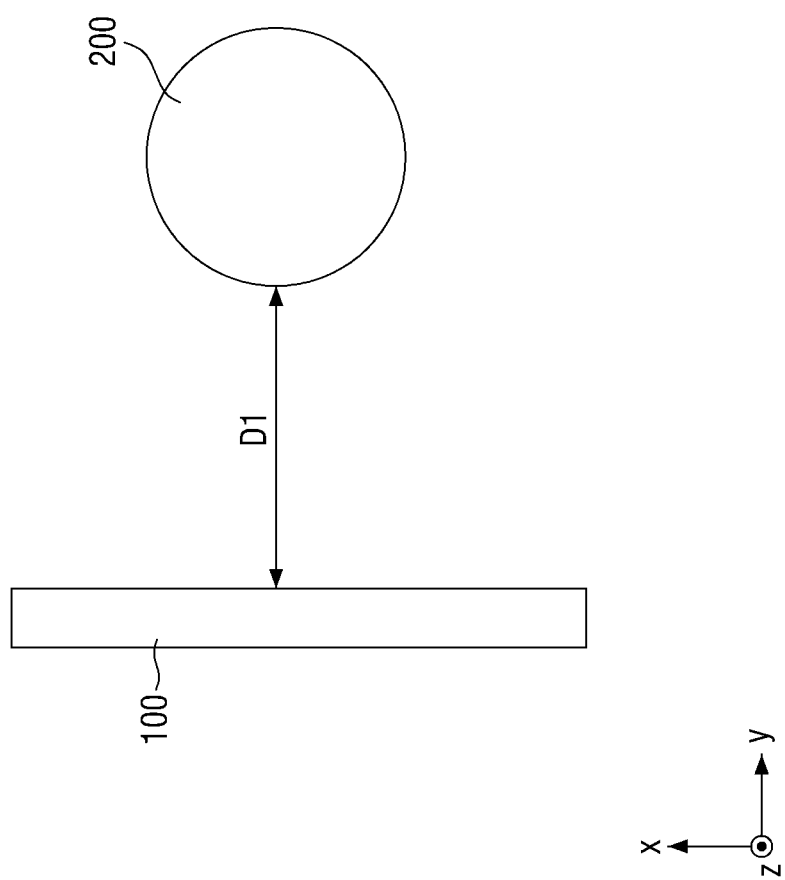
FIG. 7 is an example diagram explaining a line width (critical dimension; CD) according to an example embodiment.

FIG. 7 is an example diagram explaining a line width (critical dimension; CD) according to an example embodiment.

Referring to FIG. 7, a line width measured in the OPC rule check according to an example embodiment may be a distance D1 between a gate electrode 100 and a source/drain contact 200.

First, by applying the line width of FIG. 7, the OPC rule check method without using the probability distribution will be described with reference to FIG. 8.

FIG. 8 is an example table explaining the OPC rule check method using a line width distribution of each mask.

Referring to FIG. 8, a plurality of line widths A1 to A12 of a pattern, to which the OPC has been applied, may be formed in each of the first mask, the second mask, and the third mask. Note that, as described above, the Mask A, the Mask B, and the Mask C described in the drawings may be referred to herein as the first mask, the second mask, and the third mask, respectively.

Referring to the first table, in the first mask, the line widths A1 to A7 may not be present, the number of the line widths A8 may be B1, the number of the line widths A9 may be B2, the number of the line widths A10 may be B3, the number of the line widths A11 may be B4, and the number of the line widths A12 may be B5.

In the second mask, the line widths A1 to A7 may not be present, the number of the line widths A8 may be B3, the number of the line widths A9 may be B5, the number of the line widths A10 may be B6, the number of the line widths A11 may be B7, and the number of the line widths A12 may be B7.

In the third mask, the line widths A1 to A7 may not be present, the number of the line widths A8 may be B2, the number of the line widths A9 may be B7, the number of the line widths A10 may be B8, the number of the line widths A11 may be B9, and the number of the line widths A12 may be B10.

In this case, assuming that the critical line width (OPC rule check criterion) for the OPC rule check is the line width A8, since all of the first to third masks do not have a line width smaller than the line width A8, it is determined that the first to third masks have passed the OPC rule check.

However, when the OPC rule check is performed based on the discrete data as shown in FIG. 8, the accuracy and reliability of the OPC rule check may be deteriorated. Therefore, by applying the line width of FIG. 7, the OPC rule check method using the probability distribution according to an example embodiment will be described with reference to FIG. 9.

Figure 9:
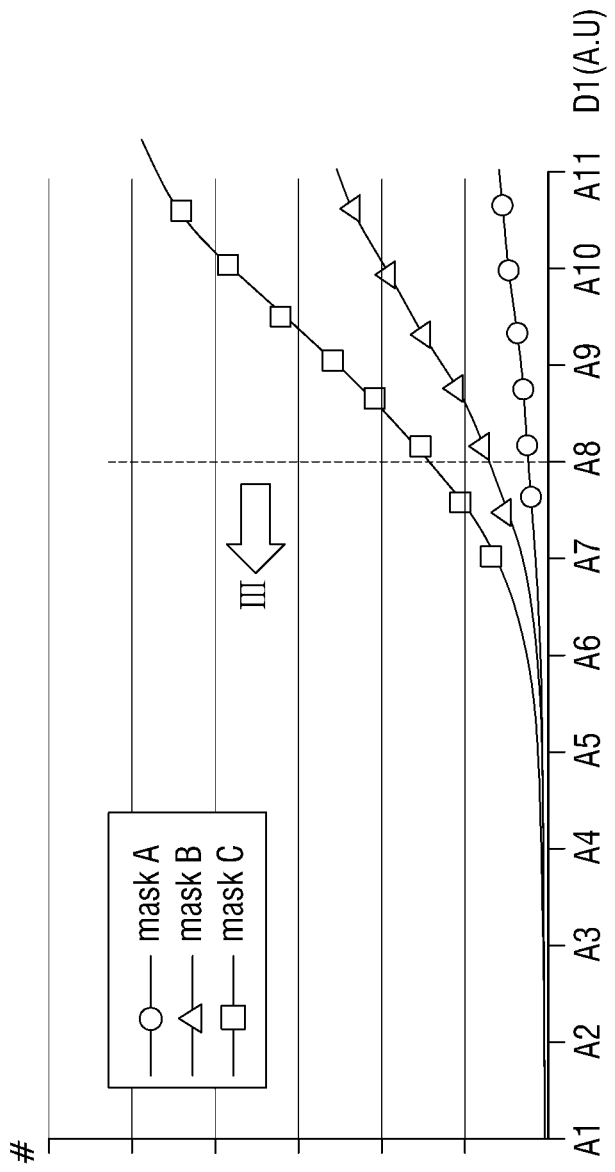
FIG. 9 is an example graph explaining the OPC rule check method using a line width distribution of each mask according to an example embodiment.

FIG. 9 is an example graph explaining the OPC rule check method using a line width distribution of each mask according to an example embodiment.

Referring to FIG. 9, the pattern line widths A1 to A12, to which the OPC has been applied, may be formed in each of the first mask, the second mask, and the third mask.

By calculating line width distributions for the first mask, the second mask, and the third mask, data as in a graph of FIG. 9 may be obtained.

In this case, it can be seen that when the OPC rule check according to an example embodiment is performed based on the critical line width A8, line widths belonging to a region III within the critical line width A8 may be formed in all of the first to third masks.

Thus, when the OPC rule check is performed by using the discrete data of FIG. 8, all of the first to third masks may pass the OPC rule check. However, as shown in FIG. 9, when the OPC rule check according to an example embodiment is performed by using the line width distribution data, the first to third masks may not pass the OPC rule check.

In this case, the OPC rule check according to an example embodiment may be performed based on whether a line width is present within the critical line width A8 (in the region III) or not, as described above. In another example embodiment, the OPC rule check may be performed by comparing a probability that a line width within the critical line width A8 (in the region III) is formed in each mask, with a critical probability.

Figure 10:
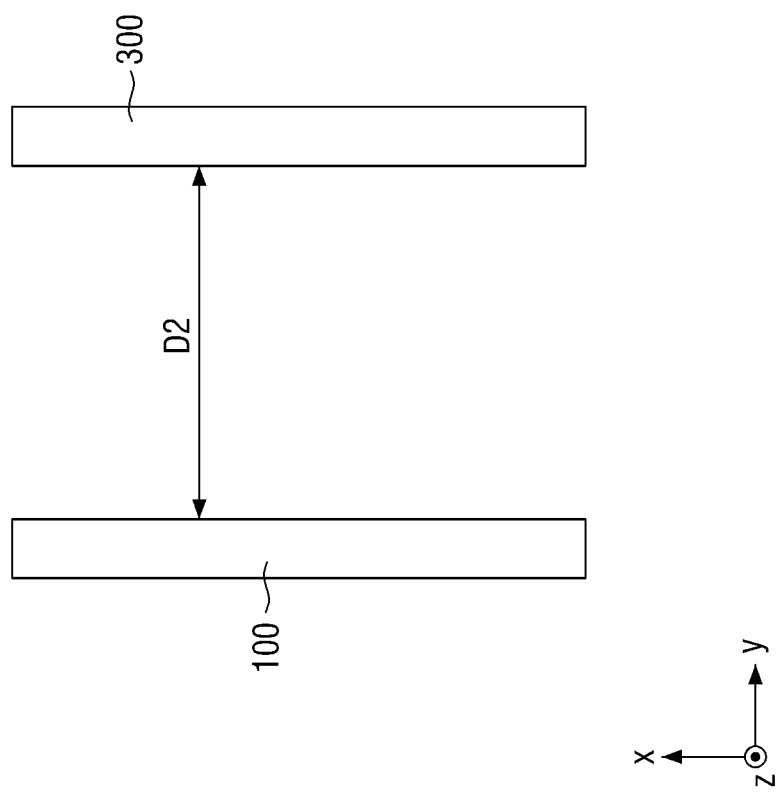
FIG. 10 is an example diagram explaining a line width according to an example embodiment.

FIG. 10 is an example diagram explaining a line width according to an example embodiment.

Referring to FIG. 10, a line width measured in the OPC rule check according to an example embodiment may be a distance D2 between the gate electrode 100 and another gate electrode 300.

Note that, the gate electrode 100 and the gate electrode 300 may be positioned at different heights in a z-direction.

First, by applying the line width of FIG. 10, the OPC rule check method without using the probability distribution will be described with reference to FIG. 11.

FIG. 11 is an example table explaining the OPC rule check method using a line width distribution in each mask.

Referring to FIG. 11, a plurality of line widths C1 to C5 of a pattern, to which the OPC has been applied, may be formed in each of the first mask, the second mask, and the third mask. Note that, as described above, the Mask A, the Mask B, and the Mask C described in the drawings may be referred to herein as the first mask, the second mask, and the third mask, respectively.

Referring to the second table, in the first mask, the line widths C1 and C2 may not be present, the number of the line widths C3 may be D1, the number of the line widths C4 may be D2, and the number of the line widths C5 may be D4.

In the second mask, the line widths C1 and C2 may not be present, the number of the line widths C3 may be D3, the number of the line widths C4 may be D4, and the number of the line widths C5 may be D7.

In the third mask, the line widths C1 and C2 may not be present, the number of the line widths C3 may be D5, the number of the line widths C4 may be D6, and the number of the line widths C5 may be D8.

In this case, assuming that the critical line width (OPC rule check criterion) for the OPC rule check is the line width C3, since all of the first to third masks do not have a line width smaller than the line width C3, it is determined that the first to third masks have passed the OPC rule check. However, when the OPC rule check is performed based on the discrete data as shown in FIG. 11, the accuracy and reliability of the OPC rule check may be deteriorated.

Therefore, by applying the line width of FIG. 10, the OPC rule check method using the probability distribution according to an example embodiment will be described with reference to FIG. 12.

Figure 12:
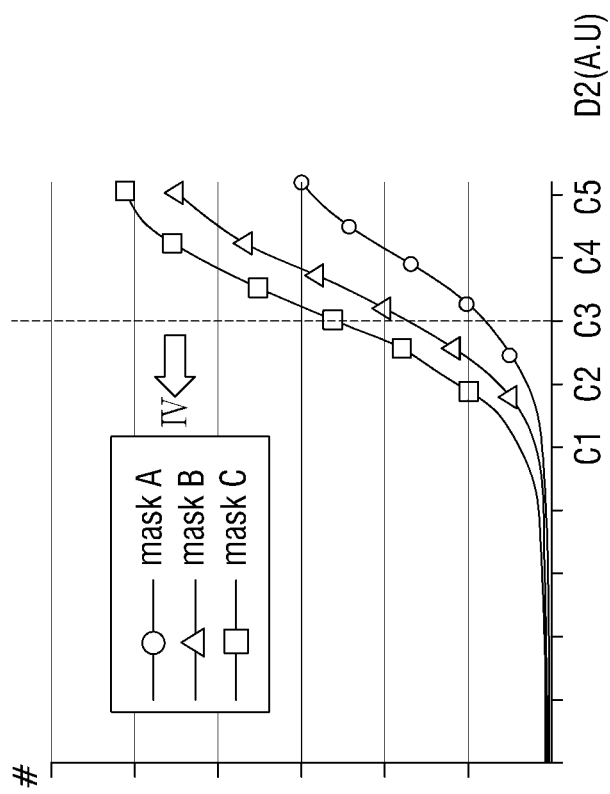
FIG. 12 is an example graph explaining the OPC rule check method using the probability distribution in each mask, according to an example embodiment.

FIG. 12 is an example graph explaining the OPC rule check method using the probability distribution in each mask, according to an example embodiment.

Referring to FIG. 12, the pattern line widths C1 to C5, to which the OPC has been applied, may be formed in each of the first mask, the second mask, and the third mask.

By calculating line width distributions for the first mask, the second mask, and the third mask, data as in a graph of FIG. 12 may be obtained.

In this case, it can be seen that when the OPC rule check according to an example embodiment is performed based on the critical line width C3, line widths belonging to a region IV within the critical line width C3 may be formed in all of the first to third masks. Thus, when the OPC rule check is performed by using the discrete data of FIG. 11, all of the first to third masks may pass the OPC rule check. However, as shown in FIG. 12, when the OPC rule check according to an example embodiment is performed by using the line width distribution data, the first to third masks may not pass the OPC rule check.

In this case, the OPC rule check according to an example embodiment may be performed based on whether a line width is present within the critical line width C3 (in the region IV) or not, as described above. In another example embodiment, the OPC rule check may be performed by comparing a probability that a line width within the critical line width C3 (in the region IV) is formed in each mask, with a critical probability.

Figure 13:
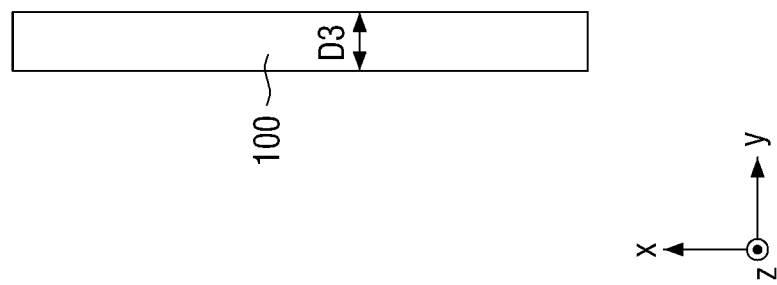
FIG. 13 is an example diagram explaining a line width according to an example embodiment.

FIG. 13 is an example diagram explaining a line width according to an example embodiment.

Referring to FIG. 13, a line width measured in the OPC rule check according to an example embodiment may be a width D3 of the gate electrode 100.

First, by applying the line width of FIG. 13, the OPC rule check method without using the probability distribution will be described with reference to FIG. 14.

FIG. 14 is an example table explaining the OPC rule check method using a line width distribution in each mask.

Referring to FIG. 14, a plurality of line widths B1 to B5 of a pattern, to which the OPC has been applied, may be formed in each of the first mask, the second mask, and the third mask. Note that, as described above, the Mask A, the Mask B, and the Mask C described in the drawings may be referred to herein as the first mask, the second mask, and the third mask, respectively.

Referring to the third table, in the first mask, the line widths B1 and B2 may not be present, the number of the line widths B3 may be F1, the number of the line widths B4 may be F2, and the number of the line widths B5 may be F4.

In the second mask, the line widths B1 and B2 may not be present, the number of the line widths B3 may be F3, the number of the line widths B4 may be F4, and the number of the line widths B5 may be F7.

In the third mask, the line widths B1 and B2 may not be present, the number of the line widths B3 may be F5, the number of the line widths B4 may be F6, and the number of the line widths B5 may be F8.

In this case, assuming that the critical line width (OPC rule check criterion) for the OPC rule check is the line width B3, since all of the first to third masks do not have a line width smaller than the line width B3, it is determined that the first to third masks have passed the OPC rule check. However, when the OPC rule check is performed based on the discrete data as shown in FIG. 14, the accuracy and reliability of the OPC rule check may be deteriorated.

Therefore, by applying the line width of FIG. 13, the OPC rule check method using the probability distribution according to an example embodiment will be described with reference to FIG. 15.

Figure 15:
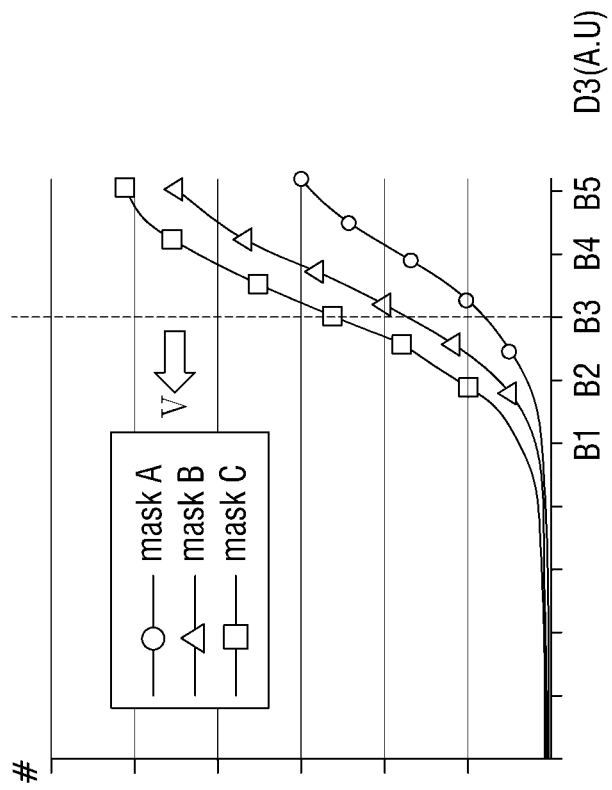
FIG. 15 is an example graph explaining the OPC rule check method using the probability distribution in each mask, according to an example embodiment.

FIG. 15 is an example graph explaining the OPC rule check method using the probability distribution in each mask, according to an example embodiment.

Referring to FIG. 15, the pattern line widths B1 to B5, to which the OPC has been applied, may be formed in each of the first mask, the second mask, and the third mask.

By calculating line width distributions for the first mask, the second mask, and the third mask, data as in a graph of FIG. 15 may be obtained.

In this case, it can be seen that when the OPC rule check according to an example embodiment is performed based on the critical line width B3, line widths belonging to a region V within the critical line width B3 may be formed in all of the first to third masks. Thus, when the OPC rule check is performed by using the discrete data of FIG. 14, all of the first to third masks may pass the OPC rule check. However, as shown in FIG. 15, when the OPC rule check according to an example embodiment is performed by using the line width distribution data, the first to third masks may not pass the OPC rule check.

In this case, the OPC rule check according to an example embodiment may be performed based on whether a line width is present within the critical line width B3 (in the region V) or not, as described above. In another example embodiment, the OPC rule check may be performed by comparing a probability that a line width within the critical line width B3 (in the region V) is formed in each mask, with a critical probability.

By way of summation and review, as a wavelength of a light source used in exposure equipment becomes close to a feature size of the semiconductor device, distortion of a pattern may occur due to diffraction, interference or the like of light. Accordingly, on the wafer, an optical proximity effect may occur in which an image having a shape different from the original shape is formed or distortion of a pattern shape is generated due to influence of the adjacent pattern. In order to prevent problems such as dimensional variation and the like due to the optical proximity effect, an optical proximity correction (OPC) process may be performed. In the OPC process, the dimensional variation during pattern transfer is predicted to deform a design pattern in advance, thereby obtaining a pattern shape according to the desired layout after the pattern transfer.

In order to improve reliability of a mask fabricated by applying the OPC process, an optical proximity correction rule check (OPC rule check; ORC) may be used to verify whether the OPC process has been correctly performed or not.

As described above, embodiments may provide an optical proximity correction rule check method capable of improving reliability of verification on an optical proximity correction performed on a mask. Embodiments may also provide a semiconductor device fabricating method including an optical proximity correction rule check method capable of improving reliability of verification on an optical proximity correction performed on a mask.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method, comprising:
    performing an optical proximity correction (OPC) on a first mask design, the first mask design including a plurality of patterns having line widths;
    measuring a number of each of the line widths within the first mask design on which the OPC has been performed;
    obtaining a probability distribution of each of the line widths within the first mask design on which the OPC has been performed;
    obtaining a distribution of each of the line widths by multiplying the number of each of the line widths by the probability distribution;
    obtaining a line width distribution of the first mask design by adding up the distribution of each of the line widths;
    comparing a probability distribution within a first critical line width in the line width distribution of the first mask design with a first critical probability; and
    performing the OPC on the first mask design again if the probability distribution within the first critical line width is greater than the first critical probability.

2. The method as claimed in claim 1, wherein the line widths indicate a distance between a source/drain contact and a gate electrode.

3. The method as claimed in claim 2, wherein the source/drain contact and the gate electrode have different heights.

4. The method as claimed in claim 1, wherein the line widths indicate a distance between adjacent gate electrodes.

5. The method as claimed in claim 4, wherein the adjacent gate electrodes have the same height.

6. The method as claimed in claim 1, further comprising:
    fabricating a first mask from the first mask design to which the OPC has been applied if the probability distribution within the first critical line width in the line width distribution of the first mask with is smaller than or equal to the first critical probability;
    transferring patterns of the fabricated first mask onto a wafer;
    comparing line widths of a plurality of patterns in the wafer with the line widths in the first mask design to determine a defect probability of the line widths in the wafer; and
    performing the OPC on the first mask design again if the defect probability is out of a process margin range.

7. The method as claimed in claim 6, further comprising:
    performing the OPC on a second mask design that is different from the first mask design if the defect probability is within the process margin range,
    wherein the second mask design includes a plurality of patterns having line widths.

8. The method as claimed in claim 7, further comprising:
    measuring a number of each of the line widths within the second mask design on which the OPC has been performed;
    obtaining a probability distribution of each of the line widths within the second mask design on which the OPC has been performed;
    obtaining a distribution of each of the line widths by multiplying the number of each of the line widths by the probability distribution;
    obtaining a line width distribution of the second mask design by adding up the distribution of each of the line widths;
    comparing a probability distribution within a second critical line width in the line width distribution of the second mask design with a second critical probability; and
    performing the OPC on the second mask design again if the probability distribution within the second critical line width is greater than the second critical probability.

9. A method, comprising:
    performing an optical proximity correction (OPC) on a first mask design, the first mask design including a plurality of patterns having line widths;

checking whether a line width smaller than a first critical line width is present in the first mask design on which the OPC has been performed;
performing the OPC on the first mask design again if a line width smaller than the first critical line width is present in the first mask design;
fabricating a first mask from the first mask design to which the OPC has been applied if a line width smaller than the first critical line width is not present in the first mask design;
transferring patterns of the fabricated first mask onto a wafer;
comparing line widths of patterns in the wafer with the line widths in the first mask design to determine a defect probability of the line widths in the wafer;
performing the OPC on the first mask design again if the defect probability is out of a process margin range;
performing the OPC on a second mask design that is different from the first mask design if the defect probability is within the process margin range, the second mask design including a plurality of patterns having line widths;
measuring a number of each of line widths within the second mask design on which the OPC has been performed;
obtaining a probability distribution of each of the line widths within the second mask design on which the OPC has been performed;
obtaining a distribution of each of the line widths by multiplying the number of each of the line widths by the probability distribution;
obtaining a line width distribution of the second mask design by adding up the distribution of each of the line widths;
comparing a probability distribution within a second critical line width in the line width distribution of the second mask design with a first critical probability; and
performing the OPC on the second mask design again if the probability distribution within the second critical line width is greater than the first critical probability, wherein the first critical probability is determined based on the defect probability.

10. The method as claimed in claim 9, wherein the line width is a distance between a source/drain contact and a gate electrode.

11. The method as claimed in claim 10, wherein the source/drain contact and the gate electrode have different heights.

12. The method as claimed in claim 9, wherein the line width is a distance between adjacent gate electrodes.

13. The method as claimed in claim 12, wherein the adjacent gate electrodes have the same height.

14. The method as claimed in claim 9, further comprising:
fabricating a second mask from the second mask design to which the OPC has been applied if the probability distribution within the second critical line width of the second mask design is smaller than or equal to the first critical probability;
transferring patterns of the fabricated second mask onto a wafer;
comparing line widths of patterns in the wafer with line widths in the second mask design to determine a defect probability of the line widths in the wafer; and
performing the OPC on the second mask design again if the defect probability is out of a process margin range.

15. The method as claimed in claim 14, further comprising:
performing the OPC on a third mask design that is different from the second mask design if the defect probability is within the process margin range,
wherein the third mask design includes a plurality of patterns having line widths.

16. The method as claimed in claim 15, further comprising:
measuring a number of each of line widths within the third mask design on which the OPC has been performed;
obtaining a probability distribution of each of the line widths within the third mask design on which the OPC has been performed;
obtaining a distribution of each of the line widths by multiplying the number of each of the line widths by the probability distribution;
obtaining a line width distribution of the third mask design by adding up the distribution of each of the line widths;
comparing a probability distribution within a third critical line width in the line width distribution of the third mask design with a second critical probability; and
performing the OPC on the third mask design again if the probability distribution within the third critical line width is greater than the second critical probability.

17. The method as claimed in claim 9, further comprising: before performing the OPC on the first mask design,
designing a layout of a weak pattern;
setting a criterion line width for patterns in the weak pattern;
checking whether the criterion line width is within a process margin range;
resetting the criterion line width if the criterion line width is not within the process margin range; and
setting the criterion line width to the first critical line width if the criterion line width is within the process margin range.

18. A method, comprising:
fabricating a semiconductor fabrication mask through an optical proximity correction (OPC) rule check; and
forming a pattern on a substrate using the semiconductor fabrication mask,
wherein the OPC rule check includes:
performing an OPC on a first mask design, the first mask design including a plurality of patterns having line widths;
checking whether a line width smaller than a first critical line width is present in the first mask design on which the OPC has been performed;
performing the OPC on the first mask design again if a line width smaller than the first critical line width is present in the first mask design;
fabricating the semiconductor fabrication mask from the first mask design to which the OPC has been applied if a line width smaller than the first critical line width is not present in the first mask design;
transferring patterns of the semiconductor fabrication mask onto a wafer;
comparing line widths of patterns in the wafer with the line widths in the first mask design to determine a defect probability of the line widths in the wafer;
performing the OPC on the first mask design again if the defect probability is out of a process margin range;
performing the OPC on a second mask design that is different from the first mask design if the defect probability is within the process margin range, the second mask design including a plurality of patterns having line widths;

measuring a number of each of line widths within the second mask design on which the OPC has been performed;

obtaining a probability distribution of each of the line widths within the second mask design on which the OPC has been performed;

obtaining a distribution of each of the line widths by multiplying the number of each of the line widths by the probability distribution;

obtaining a line width distribution of a portion of the second mask design by adding up the distribution of each of the line widths;

comparing a probability distribution within a second critical line width in the line width distribution of the portion of the second mask design with a first critical probability; and performing the OPC on the second mask design again if the probability distribution within the second critical line width is greater than the first critical probability, wherein the first critical probability is determined based on the defect probability.

19. The method as claimed in claim 18, wherein the line width is a distance between a source/drain contact and a gate electrode.

20. The method as claimed in claim 18, wherein the line width is a distance between adjacent gate electrodes.

* * * * *